United States Patent

Kawano et al.

[11] Patent Number: 6,092,678
[45] Date of Patent: Jul. 25, 2000

[54] OVERHEAD HOIST TRANSFER

[75] Inventors: Hitoshi Kawano; Masanao Murata; Susumu Nakagawa; Motonori Inagaki; Toshiyuki Takaoka, all of Ise, Japan

[73] Assignee: Shinko Electric Co., Ltd., Tokyo, Japan

[21] Appl. No.: 09/323,833

[22] Filed: Jun. 2, 1999

[30] Foreign Application Priority Data

Jun. 6, 1998 [JP] Japan .................................. 10-157546

[51] Int. Cl.$^7$ .................................................. B66C 13/48
[52] U.S. Cl. ............................. 212/86; 212/286; 340/685
[58] Field of Search ........................... 901/4, 5; 212/276, 212/286, 86; 340/685

[56] References Cited

U.S. PATENT DOCUMENTS

| | | | |
|---|---|---|---|
| 4,685,862 | 8/1987 | Nagai et al. ................................. | 901/5 |
| 4,817,017 | 3/1989 | Kato ............................................ | 901/5 |
| 4,831,548 | 5/1989 | Matoba et al. .............................. | 901/5 |
| 5,117,992 | 6/1992 | Simkus et al. .......................... | 212/276 |
| 5,748,854 | 5/1998 | Watanabe et al. .......................... | 901/4 |
| 5,790,407 | 8/1998 | Strickland et al. ....................... | 212/86 |
| 5,822,498 | 10/1998 | Kumasaka et al. .......................... | 901/4 |
| 5,912,540 | 6/1999 | Kosaka et al. .............................. | 901/4 |

Primary Examiner—Thomas J. Brahan
Attorney, Agent, or Firm—Oblon, Spivak, McClelland, Maier & Neustadt, P.C.

[57] ABSTRACT

In an overhead hoist transfer having a moving carriage with a hand portion, which holds a load, elevatably suspended therefrom; and a means for teaching an appointed stop position on a placement base, on which said load is placed, to said moving carriage, LEDs 7a and 7b are installed at the hand portion 6, and a position detecting portion 12 consisting of a lens 12a and PSD 12b is installed at the placement base 53 side, in order to automatically and accurately enable a teaching of position correcting data in a short time without use of any manpower. Further, a teaching portion is installed, which detects a deviation between the present stop position and the above appointed stop position on the basis of the relative position of the hand portion 6 with respect to the placement base, which is obtained by the position detecting portion 12, and carries out a teaching to the moving carriage by, for example, radio, whereby it is not necessary for an operator to carry out a teaching by actually moving the hand portion, wherein it is possible to accurately carry out a teaching of position correcting data in a short time.

8 Claims, 6 Drawing Sheets

OVERHEAD HOIST TRANSFER

BACKGROUND OF THE INVENTION

1. Field of the Invention

The present invention relates to an overhead hoist transfer which transfers semiconductor wafers, etc., in a semiconductor clean room, etc., and in particular an overhead hoist transfer comprising a moving carriage having a hand portion, which holds a load, elevatably suspended therefrom, and a means for teaching an appointed stop position just above a placement base on which the above load is placed.

2. Description of the Prior Art

In, for example, a semiconductor clean room, etc., semiconductor wafers are frequently transferred between equipment to equipment, between equipment and a stocker, etc., in the production of semiconductor devices. As one of the apparatuses which transfer such semiconductor wafers, an overhead hoist transfer (hereinafter called "OHT") which causes a moving carriage, from which a load is suspended, to travel along a rail has been particularly noted. Hereinafter, a description is given of an OHT used in a general semiconductor clean room.

FIG. 5 shows a state in a semiconductor clean room in which a general OHT is installed. In a semiconductor clean room shown in the same drawing, a plurality of processing apparatuses 51 and stockers 52 are disposed, and a load port 53 (an example of a placement base) on which a wafer carrier W (an example of a load) is installed on the respective processing apparatuses 51 and stockers 52. In addition, an OHT 61 is installed in the vicinity of a ceiling, which transfers a wafer carrier W between the above processing apparatuses 51 and stockers 52.

The OHT 61 is composed of a rail 62 disposed in the vicinity of a ceiling so that the processing apparatuses 51 and the stockers 52 are connected to each other, a moving carriage 63 travelling along the rail 62, and a hand portion 65 suspended from the moving carriage 63 by a suspension member 64 (See FIG. 6). The hand portion 65 is elevated and lowered by winding and unwinding the suspension member 64 by means of a winding device (not illustrated) which is installed in the moving carriage 63.

FIG. 7 is a cross-sectional view showing the relationship in position between the rail 62, the moving carriage 63, which constitutes the OHT 61, the processing apparatuses 51, and the load port 53 of the stocker 52. As shown in the same drawing, the rail 62 is disposed so that the center position of a wafer carrier W placed on the load port 53 is made roughly coincident with the center position of the hand portion 65. However, it is difficult to strictly coincide these two center positions with each other. In fact, many cases exist where some positional deviation occurs. This is the same as regards a deviation (deviation in the stop position) in the direction along the rail 62. However, in a state where such a deviation occurs, actions of holding and placing the wafer carrier W by the hand portion 65 cannot be accurately carried out. Therefore, the moving carriage 63 is provided with a position correcting device 66 which micro-moves the suspension member 64 and hand portion 65 in the X, Y directions (two directions in the horizontal plane) and θ direction (rotation direction in the horizontal plane). The position correcting device 66 operates on the basis of position correcting data taught in advance for each of the processing apparatuses 51 and stockers 52.

Herein, teaching of the position correcting data is performed by accurately positioning the center position of the hand portion 65 at the center position of the wafer carrier W while actually causing the above position correcting device 66 to move by radio (or by electric waves, infrared rays, etc.) by operating a teaching box. In detail, for example, the teaching is carried out in compliance with the following procedure. Also, the position correcting data to be taught here include a moving distance (elevating distance of the hand portion 65) in the Z direction (the perpendicular direction) in addition to the position correcting distances in the above X, Y and θ directions.

(1) The moving carriage 63 is caused to stop on an appointed load port 53 by operating the teaching box. At this time, the moving carriage 63 automatically stops by, for example, reading a stop mark secured at an appointed position on the above rail 62 (At this time, it is assumed that the coordinates of the hand portion are $X_0$, $Y_0$, $Z_0$, and $\theta_0$).

(2) By operating the teaching box, the hand portion 65 is caused to move in the X, Y, Z and θ directions, whereby the wafer carrier W is placed on the load port 53 or is positioned at a position where the wafer carrier W is taken away from the load port 53 (the coordinates of the hand portion are assumed to be $X_i$, $Y_i$, $Z_i$, and θ after the positioning is finished)

(3) $(X_i-X_0, Y_i-Y_0, Z_i-Z_0$, and $\theta_i-\theta_0)$ are calculated. The data are used as position correcting data and stored in a memory in the moving carriage 63.

By repeating the above procedures for each of the moving carriages and load ports, the teaching of the position correcting data is carried out.

Continuously, a brief description is given of the procedures of transfer actions made by the OHT 61.

(1) An empty moving carriage 63 is caused to move the instructed processing apparatus 51 or stocker 52 (the source of transfer) and is caused to stop at an appointed stop point.

(2) The position correcting device 66 is caused to move on the basis of the position correcting data taught in advance, whereby the center position of the hand portion 65 is made coincident with the center position of the wafer carrier W on the load port 53.

(3) Lowering the hand portion 65, the wafer carrier W on the load port 53 is held. After that, the hand portion 65 is elevated.

(4) The moving carriage 63 is caused to move upward of the instructed processing apparatus 51 or stocker 52 (the target of transfer), and is caused to stop at an appointed stop point.

(5) Actuating the position correcting device 66 on the basis of the position correcting data taught in advance, the center position of the hand portion 65 is made coincident with the center position of the wafer carrier W on the load port 53.

(6) Lowering the hand portion 65, the wafer carrier W held by the hand portion 65 is placed on the load port 53. After that, the hand portion 65 is elevated.

However, since, in the above conventional OHT 61, it was necessary to teach the position correcting data to each of the load ports 53 by the hand of an operator on the basis of the above procedures, time and manpower required for the teaching work were tremendously great. For example, generally, in the case of a process (20 through 30 m long) called a "bay", since there are generally approximately 30 (or 15 through 40) units of processing apparatuses, the number of times of teaching will be as follows if it is assumed that, for example, three moving carriages are provided;

3 (quantity of moving carriages)×30(quantity of apparatuses)×2(Number of ports)×2(loading and unloading) =360 times.

In addition, where it is assumed that 10 bays are provided, the number of times of teaching will be 3,600 times, wherein if it is assumed that ten minutes are required per teaching, it takes 600 hours in total in the teaching work, which is tremendously great. Moreover, one to two persons are required for the above work per moving carriage for a longer peroid of time.

SUMMARY OF THE INVENTION

The present invention was developed in view of the above shortcomings and problems, and it is therefore an object of the invention to provide an overhead hoist transfer which is capable of automatically and accurately teaching position correcting data in a short time without requiring any manpower.

In order to achieve the above object, an overhead hoist transfer according to the invention has; a moving carriage having a hand portion, which holds a load, elevatably suspended therefrom; and a teaching means for teaching an appointed stop position on a placement base, on which the above load is placed, to the above moving carriage, and further comprising; an appointed featuring portion secured at the above hand portion side or the above placement base side; a position detecting means, which is provided at the above placement base side or the above hand portion side, for detecting the position of the above appointed featuring portion; and a stop position deviation detecting means for detecting a deviation between the present stop position and the above appointed stop position on the basis of the relative position of the above hand portion obtained by the above position detecting means with respect to the above placement base; and wherein the above teaching means teaches the above stop position on the basis of the above deviation quantity obtained by the stop position deviation detecting means.

Further, if the above appointed featuring portion is installed on a load held by the hand portion, it can be easily removed at a time other than when performing a teaching. As a combination of the above position detecting means and the above appointed featuring portion, for example, a two-dimensional position detecting element and a limit emitting body, or a CCD camera and an identification mark can be considered.

In addition, if a sway controlling means is provided, which controls sways of the above hand portion, it is possible to suppress the sways of the hand portion in a short time, and this enables acceleration of teaching work.

With an overhead hoist transfer according to the invention, the relative position of the above appointed featuring portion (for example, light emitting means) is detected by a stop detecting means (for example, a two-dimensional position detecting element) when teaching stop positions to the moving carriage, wherein on the basis of the relative position, a deviation between the present stop position and the above appointed stop position, that is, a correcting amount of the stop position, can be automatically obtained by a stop position deviation detecting means, the deviation is taught to the moving carriage. Therefore, it is not necessary for an operator to teach by actually moving the hand portion, wherein a teaching of position correcting data can accurately be carried out in a short time.

DETAILED DESCRIPTION OF THE PREFERRED EMBODIMENTS

A description is given of preferred embodiments of the invention with reference to the accompanying drawings in order to better understand the invention. Also, the following embodiments and examples are only some of examples in which the invention is embodied, and do not imply limitations on the technical scope of the invention.

Figure 1:
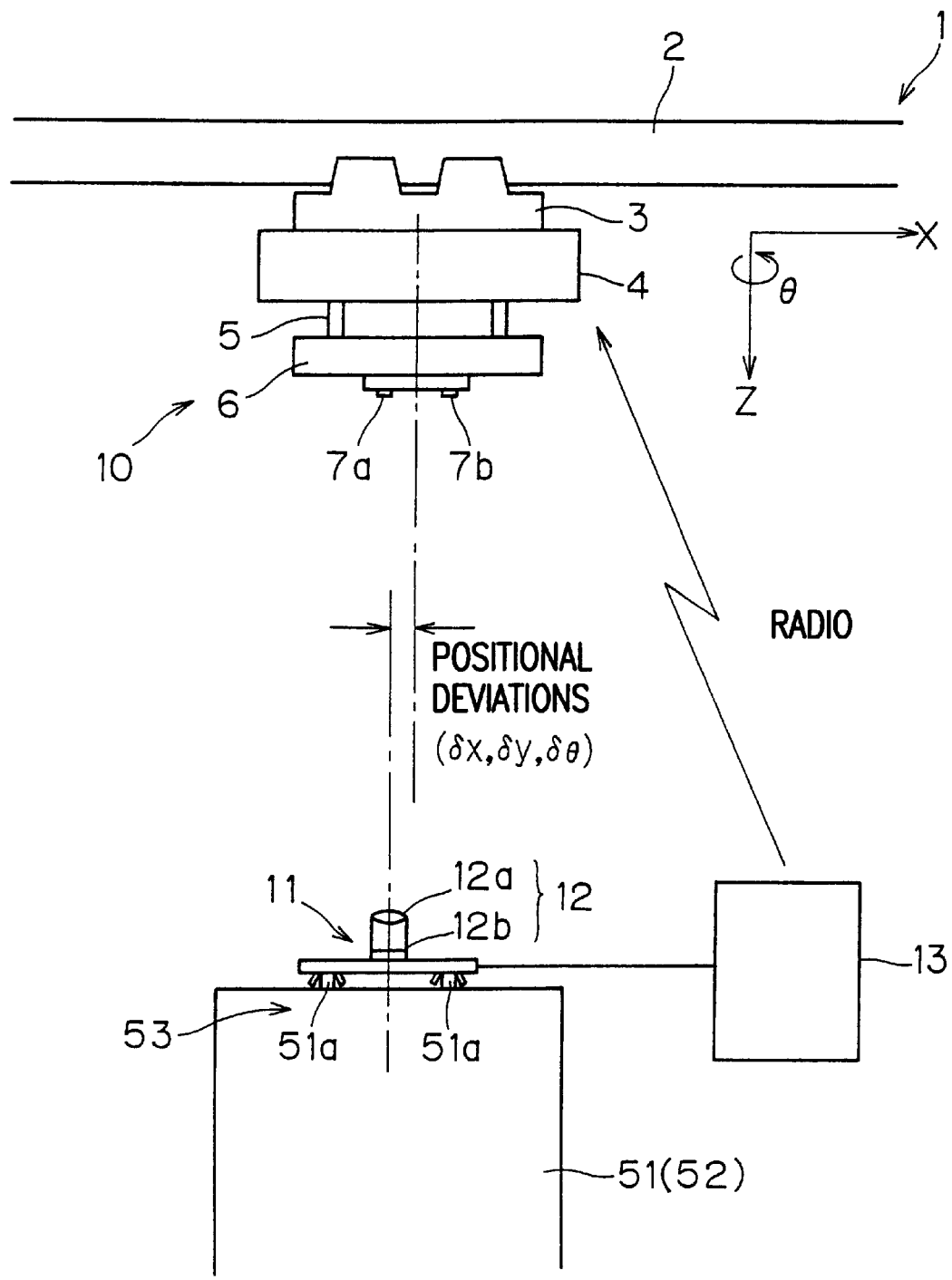
FIG. 1 is a exemplary view showing an outlined construction of an OHT 1 according to a preferred embodiment of the invention.

An OHT 1 (Overhead hoist transfer) according to the preferred embodiment is installed in a semiconductor clean room as well as the above conventional OHT 61, and is provided with such an outlined construction as shown in FIG. 1.

The above OHT 1 is composed of a rail 2 secured in the vicinity of a ceiling so as to connect processing apparatuses 51 and stockers 52, a moving carriage 10 travelling along the rail 2, a positional deviation detecting fixture 11 placed on the processing apparatuses 51 and load ports 53 of the stockers 52, and a teaching portion 13 (which may be incorporated integrally in the above positional deviation detecting fixture 11) connected to the positional deviation detecting fixture 11.

The moving carriage 10 is further composed of a travelling portion 3 equipped with a drive source to travel along the rail 2, a positioning actuator 4 relatively movable on the horizontal plane (X, Y and θ direction as shown in FIG. 1) with respect to the above travelling portion 3, and a hand portion 6 suspended from the positioning actuator 4 by a suspension member 5. Two light emitting diodes (hereinafter called "LED") 7a and 7b (one example of the means for indicating an appointed portion) are attached on the underside of the hand portion 6 to become symmetrical around the center position of the hand portion 6 at an appointed interval Ls. Also, the hand portion 6 is elevated and lowered by winding and unwinding of the suspension member 5 by a winding device (not illustrated) which is installed in the positioning actuator 4.

The positional deviation detecting fixture 11 is positioned and installed on the above load ports 53 utilizing kinematic pins 51a fixed to position a wafer carrier W. In addition, a position detecting portion 12 (one example of a position detecting means) composed of a lens 12a and a position sensitive detector (hereinafter called "PSD") 12b is attached to a part corresponding to the center position of the wafer carrier W in the positional deviation detecting fixture 11. The position detecting portion 12 receives light emitted from the LEDs 7a and 7b attached to the hand portion 6, thereby detecting the light receiving position.

The teaching portion 13 calculates positional deviations (δx, δy, δθ) of the hand portion 6 on the basis of the light received position detected by the position detecting portion 12 of the position deviation detecting fixture 11, at the same time it transmits the calculated positional deviations to the moving carriage 10 by radio (or by electric waves, infrared rays, etc.), and stores the data as position correcting data.

In the following, a description is given of a calculation method of positional deviations ( δx, δy, δθ) of the hand portion 6 by the positional deviation detecting fixture 11 and teaching portion 13.

Figure 2:
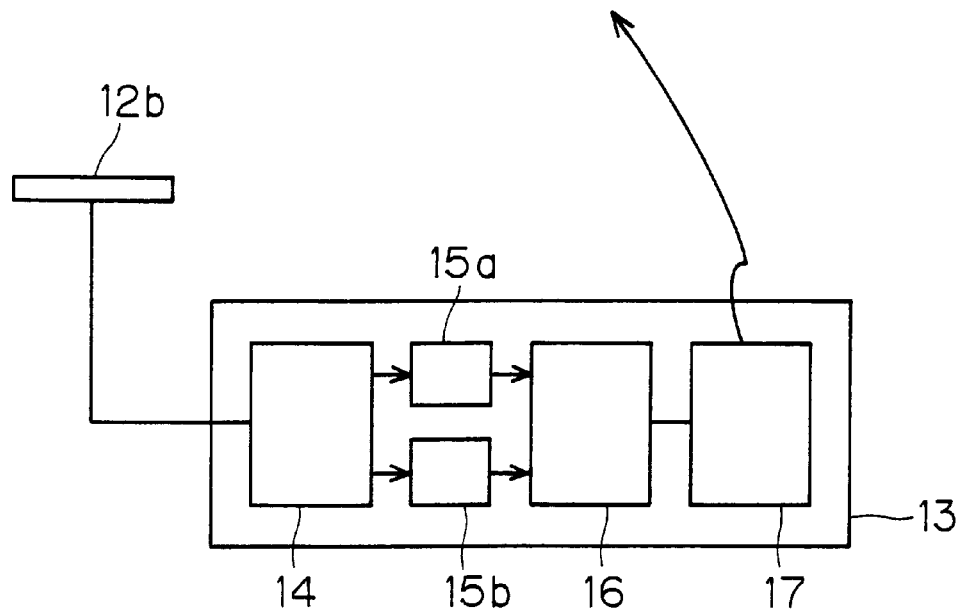
FIG. 2 is a block diagram showing an outlined construction of a teaching portion 13 of the above OHT 1.

As shown in FIG. 2, the teaching portion 13 is provided with a light spot position calculating portion 14, memory elements 15a and 15b, a position posture calculating portion 16 and a transmission portion 17.

The light spot position calculating portion 14 calculates and outputs coordinate values of a light spot on the PSD 12b on the basis of output signals of the PSD 12b. The coordinate value date corresponding to the LEDs 7a and 7b outputted by the light spot position calculating portion 14 are individually stored in any one of memory elements 15a and 15b. Also, the LEDs 7a and 7b attached to the hand portion 6 are controlled so as to alternately flicker at an appointed interval. Therefore, the light spot position calculating portion 14 alternately stores the calculated coordinate values in the memory elements 15a and 15b.

The position posture calculating portion 16 calculates the positions in the horizontal and perpendicular directions and a rotating angle around the perpendicular axis on the basis of the coordinate value data, which respectively, stored in the memory elements 15a and 15b, of the light spot position on the PSD 12b with respect to the LEDs 7a and 7b. The calculation method is explained with reference to FIG. 3.

Figure 3:
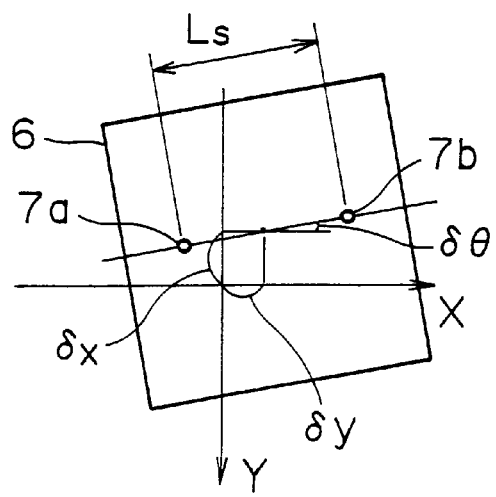
FIG. 3 is an explanatory view of a position posture of the hand portion 6.

FIG. 3 is a view observed from downward of the hand portion 6. A coordinate system to be used is such that the X axis and Y axis are established in the horizontal plane and the Z axis is established in the perpendicular direction, the origin of which is determined at the center of the lens 12a (See FIG. 3). In the position posture calculating portion 16, deviations δx and δy, and a skew angle δθ in the horizontal plane, and a distance δz between the position deviation detecting fixture 11 and the hand portion 6 are calculated by the following expressions.

$$m = \frac{L_s}{\sqrt{(x_a - x_b)^2 + (y_a - y_b)^2}} \quad (1)$$
$$\delta x = \frac{x_a + x_b}{2} m$$
$$\delta y = \frac{y_a + y_b}{2} m$$
$$\delta z = f_e m$$
$$\delta \theta = \tan^{-1}\left(\frac{x_a - x_b}{y_a - y_b}\right)$$

wherein (Xa, Ya) and (Xb, Yb) are, respectively, coordinate values of light condensing spots of the respective LEDs 7a and 7b, Ls is a set distance between the LEDs 7a and 7b, fe is a distance between the lens 12a and the PSD 12b.

The positional deviations (δx, δy, δθ) of the hand portion 6, which are obtained by the position posture calculating portion 16 are transmitted to the moving carriage 10 by radio via the transmission portion 17, and are stored in the memory of the moving carriage 10 as position correcting data.Also, the hand portion 6 may be corrected on the basis of the position correcting data (δx, δy, δθ), which are obtained by the position posture calculating portion 16, whereby teacing work may be carried out.

Subsequently, a description is given of one example of processing procedures of teaching and transferring by the OHT 1.

(In teaching)

(1) A positional deviation detecting fixture 11 is set on a load port 53 to which a teaching is applied.

(2) A teaching action is commenced by operating a teaching start switch (not illustrated), etc., and the moving carriage 10 is caused to stop at the appointed load port 53. At this time, the moving carriage 10 automatically stops by reading a stop mark secured at an appointed position on, for example, the rail 2. Also, a load port 53, to which a teaching is applied, may be set each time by an operator, or the respective load ports 53 may be automatically selected in an appointed sequence, whereby teaching work may be automatically carried out one after another.

(3) The positional deviations (δx, δy, δθ) are calculated by the method described above, and are stored in a memory in the moving carriage 10 as position correcting data in a state where the hand portion 6 is located uppermost.

The above process is repeated for each of the load ports 53.

(In transferring)

(1) The moving carriage 10 automatically stops on the reference load port 53 by reading a stop mark.

(2) The moving carriage reads the position correcting data (δx, δy, δθ) corresponding to the loadport 53 where it stops, and the position of the hand portion 6 is corrected by the positioning actuator 4 on the basis of the position correcting data.

(3) The hand portion 6 is lowered, and caused to hold or place a wafer carrier W.

(4) The hand portion 6 is elevated, whereby the moving carriage 10 travels to the next load port 53.

As described above, the OHT 1 according to the preferred embodiment is capable of automatically obtaining position correcting data without positioning the hand portion by operating it when a teaching is carried out, the time :required for teaching work can be shortened, and at the same time, only slight manpower is enough to perform the teaching work, wherein a teaching can be carried out without taking it into consideration individual differences in operators.

(Modification)

The preferred embodiment is constructed so that, when a teaching is carried out, the positional deviation is calculated in a state where the hand portion 6 is located uppermost. However, it may be constructed so that the positional deviation may be calculated in a state where the hand portion 6 is lowered to the holding position of the wafer carrier W after the moving carriage 10 comes to a stop, whereby the detection accuracy is improved although the time required for a teaching is made longer.

As described above, since the distance δz in the perpendicular direction between the positional deviation detecting fixture 11 and the hand portion 6 can be detected if the above positional deviation detecting fixture 11 and the teaching portion 13 are used (See the above expression (1)), the lowering amount of the hand portion 6 can be added to the items of teaching. If the lowering amount of the hand portion 6 is not added to the teaching items, by providing the hand portion 6 with a sensor to sense the grip of the wafer carrier W, positioning may be carried out whenever performing transfer work.

In addition, the above positioning actuator 4 maybe adjusted for positioning in only the Y direction (the direction vertical to the rail 2) and θ direction (around the perpendicular axis), and the position adjustment in the X direction (the direction parallel to the rail 2) may be carried out by the travelling portion 3.

Also, although the above LEDs 7a and 7b may be fixedly installed, for example, a wafer carrier W or a fixture having the same shape as that of the wafer carrier W is attached to hold the hand portion 6, whereby it is possible to easily remove it at any time other than when carrying out a teaching.

Further, the positional deviation detecting fixture 11 may be provided at the hand portion 6 side, and the above LED may be secured at the load port 53 side.

Moreover, the position detecting means is not limited to the means which is provided with the above PSD and LEDs. For example, a CCD camera may be provided instead of the position detecting portion 12, and an identification mark may be provided instead of the above LEDs 7a and 7b.

In addition, when a teaching is carried out, it is necessary to carry out position defecting in a state where the hand portion completely stops and there is no sway. However, if an operator waits for a complete stop until the sway of the hand portion 6 naturally stops, the teaching work cannot be quickly carried out, and it is cumbersome to manually stop the hand portion which is still swaying. Particularly, this causes a problem in a case where the positional deviation is calculated by causing the hand portion to lower. Therefore, it is effective to control sways, whereby the sways of the hand portion 6 can be attenuated in a short time. Hereinafter, a description is given of an example in which a sway controlling portion is incorporated on the moving carriage 10 of the above OHT 1.

Figure 4:
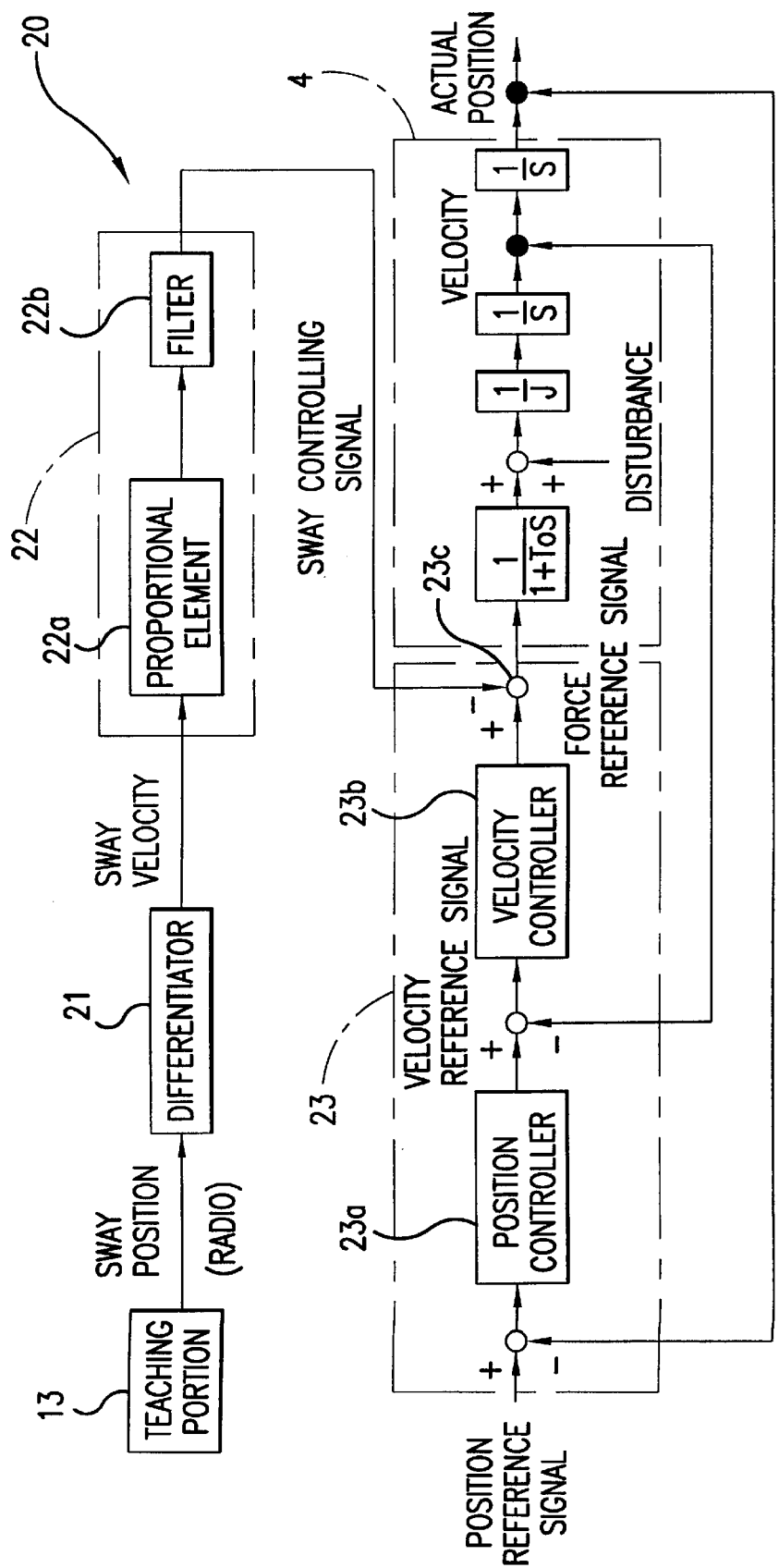
FIG. 4 is a block diagram showing an outlined construction of an elevating portion position controlling device 20 of the above OHT 1.
Figure 5:
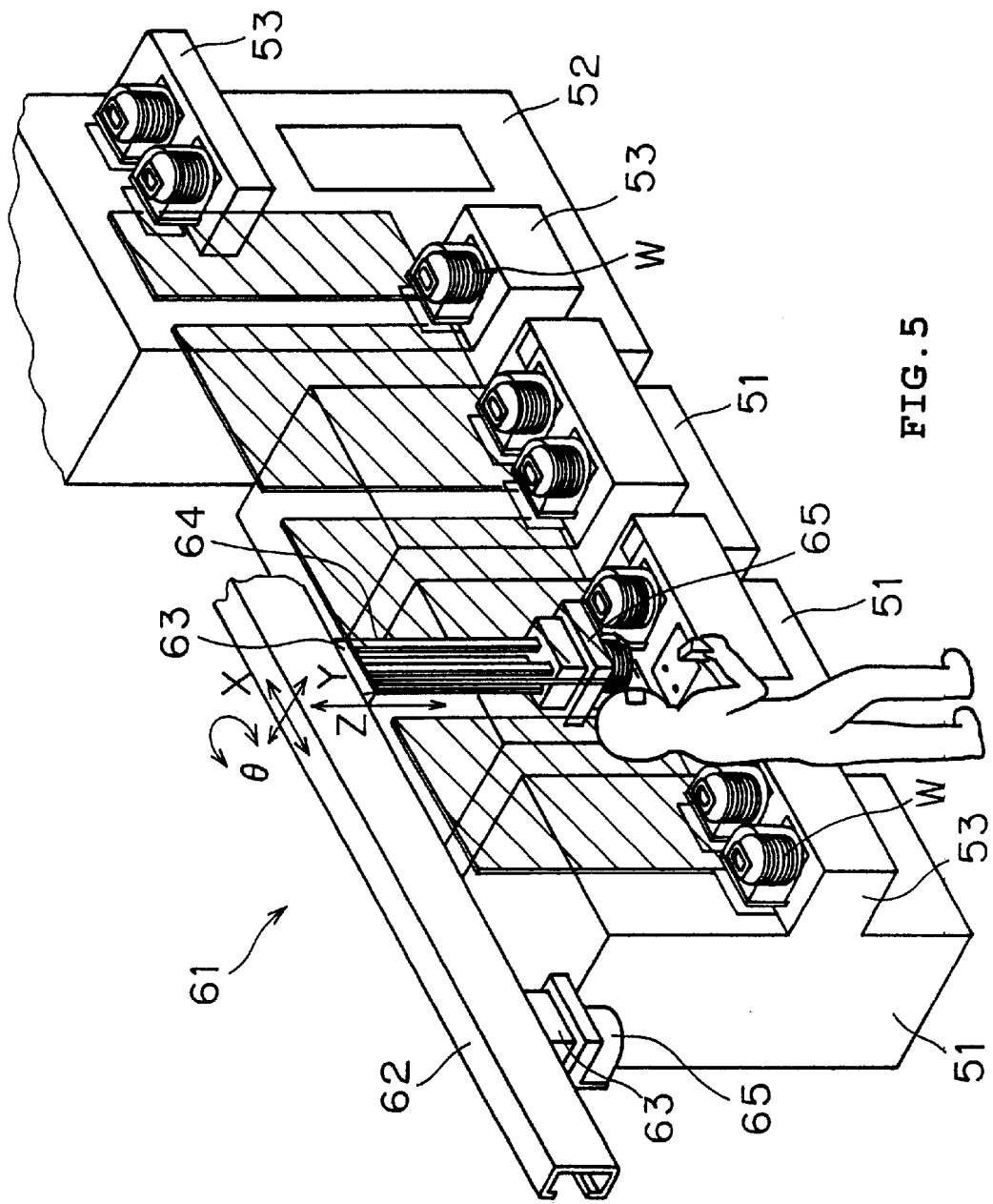
FIG. 5 is an exemplary view showing a state in a semiconductor clean room in which an OHT 61 according to a prior art is installed.
Figure 6:
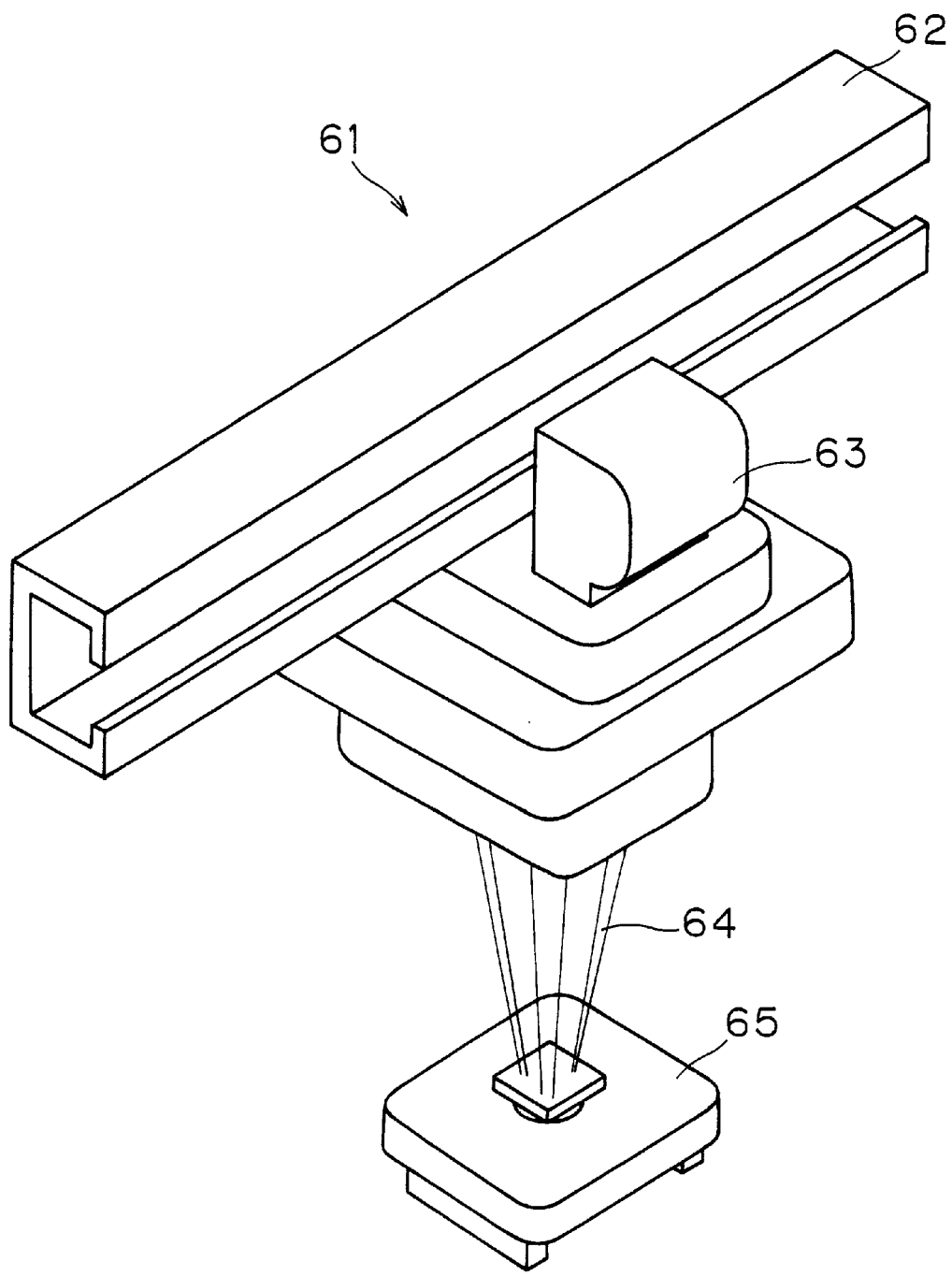
FIG. 6 is an exemplary view showing an outlined construction of the above OHT 61.
Figure 7:
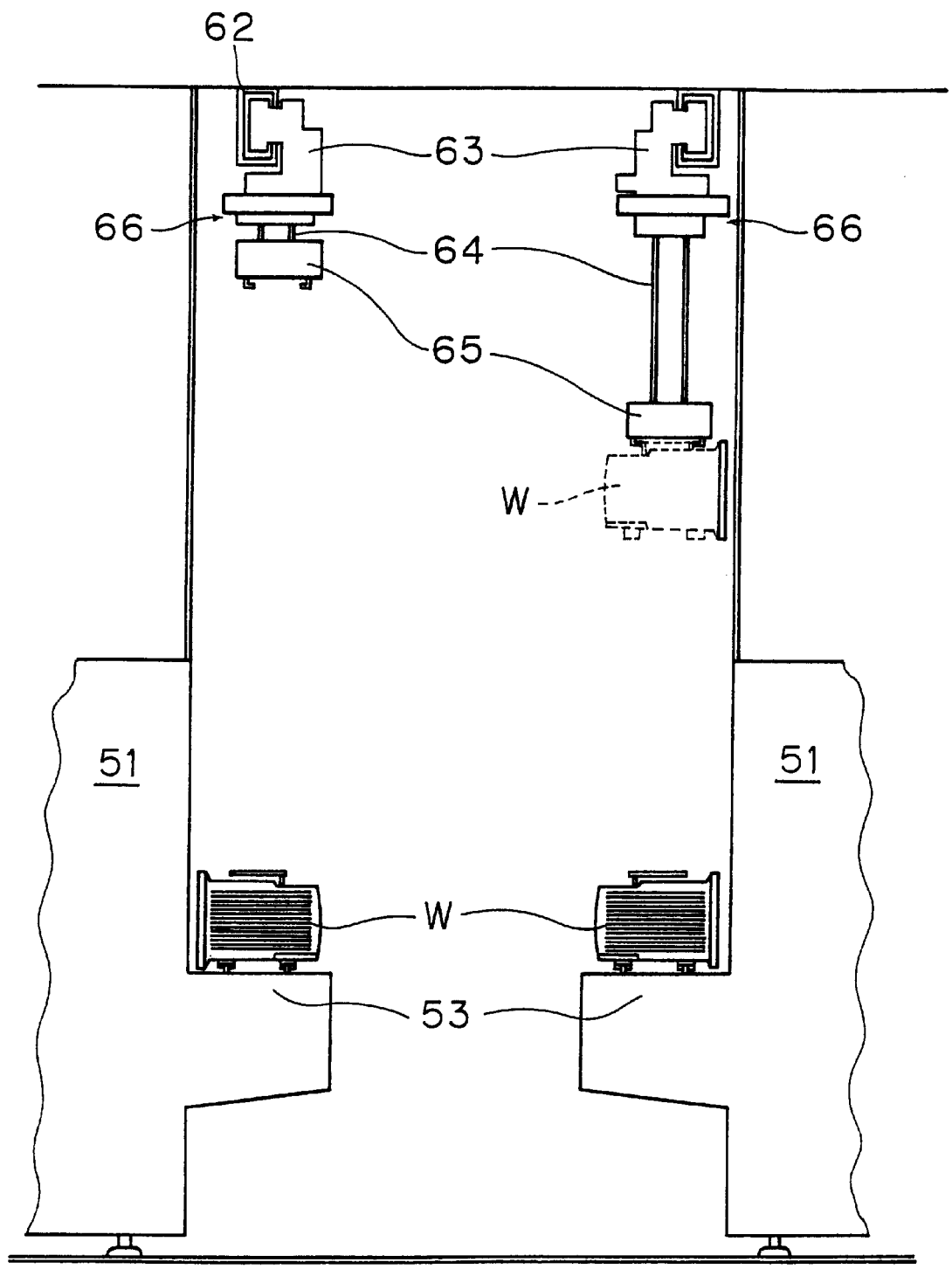
FIG. 7 is a cross-sectional view showing the relationship in a position between the OHT 61 and load port 53.

As shown in FIG. 4, the sway controlling portion 20 incorporated on the moving carriage 10 is composed of the above positioning actuator 4, a positioning controller 23, a differentiator 21, and a sway stop compensating portion 22.

The positioning controller 23 is further provided with a position controller 23a which outputs a velocity reference signal to the positioning actuator 4 on the basis of a deviation between the position reference signal and the actual position, a velocity controller 23b which outputs a force reference signal to the positioning actuator 4 on the basis of the deviation between the velocity reference signal and the actual velocity to the above positioning actuator 4, which are outputted from the position controller 23a, and an addition means 23c for adding a sway controlling signal outputted from the sway stop compensating portion 22 to the force reference signal outputted from the above velocity controller 23b by reversing the phase of the sway controlling signal.

In addition, the sway stop compensating portion 22 is composed of a proportional element 22a and a filter 22b, wherein a sway controlling signal is outputted on the basis of a sway speed obtained by differentiating the sway position (positions $\delta x$ and $\delta y$, in the horizontal direction, and position $\delta \theta$ around the perpendicular axis) of the above hand portion 6, which is outputted from the above teaching portion 13, by the above differentiator 21. Also, an optimal value in compliance with a suspension length of the hand portion 6 is used in the above proportional element 22a. Further, the filter 22b is a low pass filter which is provided to prevent the servo system from oscillating due to observation noise by removing he above observation noise.

A description is given of a sway controlling action made by the above sway controlling portion 20 with respect to the above hand portion 6.

As the moving carriage 10 stops at a reference position, a position reference signal to control the positioning actuator 4 at, for example, an appointed reference point, is given to the above positioning controller 23. The above position reference signal takes a deviation (positional deviation) from the actual position of the positioning actuator 4, and the deviation is inputted into the position controller 23a. A velocity reference signal is outputted from the position controller 23a so that the above positional deviation becomes zero, and further, the velocity reference signal takes a deviation (positional deviation) from the actual velocity of the positioning actuator 4, and the deviation is inputted into the above velocity controller 23b. A force reference signal is outputted from the velocity controller 23b so that the above velocity deviation becomes zero.

Simultaneously, a sway velocity obtained by differentiating by the differentiator 21 the sway position of the hand portion 6, which is transmitted from the teaching portion 13 by radio, is inputted into the above sway stop compensating portion 22.

A force responsive to a sway velocity of the hand portion 6 is outputted by the proportional element 22a, and observation noise is removed from the force by the filter 22b and is outputted to the positioning controller 23 as a sway controlling signal.

The sway controlling signal outputted from the sway stop compensating portion 22 is added to the force reference signal outputted from the velocity controller 23b in the positioning controller 23 after the phase thereof is reversed, wherein the corresponding force reference signal is inputted into the positioning actuator 4. In the positioning actuator 4, actions responsive to the inputted force reference signal are carried out.

By the above control, if there are sways at the hand portion 6, the positioning actuator 4 equivalently makes displacement in proportion to a sway velocity of the hand portion 6 in a case where the sway frequency is sufficiently lower than the velocity controlling frequency. Herein, if a position deviation occurs between the positioning actuator 4 and the hand portion 6, a force operates on the hand portion 6 proportionally thereto. Therefore, a force proportional to the sway velocity of the hand portion 6 itself will be given to the hand portion 6 as an attenuation force, wherein the sways of the hand portion 6 is suppressed in a short time.

As described above, since the sway controlling portion 20 is provided, the sways of the hand portion 6 is suppressed in a short time, and teaching work can be carried out quickly.

As described above, the invention is an overhead hoist transfer having a moving carriage having a hand portion capable of holding a load elevatably suspended therefrom, and a teaching means for teaching an appointed stop position on a placement base on which the above load is placed with respect the moving carriage, which further comprises an appointed featuring portion installed at the hand portion side or the placement base side, a position detecting means, installed at the placement base side or the hand portion side, for detecting the position of the appointed featuring portion, and a stop position deviation detecting means for detecting a deviation between the present stop position and the above appointed stop position on the basis of the relative position of the hand portion, which is obtained by the position detecting means with respect to the placement base, wherein the above teaching means teaches the above stop position on the basis of the above deviation obtained by the stop position deviation detecting means. Therefore, since it is not necessary for an operator to carry out a teaching by actually moving the hand portion, the position correcting data can be taught accurately in a short time. Further, a teaching can be performed without taking it into consideration individual differences in operators.

In addition, if the appointed featuring portion is installed on a load held by the hand portion, the featuring portion can be easily removed at any time other than when a teaching is carried out.

Further, if a sway controlling means which performs a sway control of the hand portion is provided, the sways of the hand portion is suppressed in a short time, whereby a teaching can be accelerated.

What is claimed is:

1. An overhead hoist transfer device having a moving carriage with a hand portion, said hand portion being configured to hold a load and elevatably suspended from said moving carriage, said overhead hoist transfer device comprising:

a teaching means for teaching an appointed stop position just above a placement base on which said load is placed;

an indicating means for indicating an appointed portion, said indicating means located on said hand portion or said placement base; and a position detecting means, which is provided at said placement base or said hand portion, for detecting the position of said indicating means; and wherein said teaching means detects a deviation between a present stop position and said appointed stop position on the basis of a relative position of said hand portion with respect to said placement base obtained by said position detecting means, and teaches said appointed stop position on the basis of said deviation.

2. An overhead hoist transfer device as set forth in claim 1, wherein:

said indicating means is installed on said hand portion or said placement base only during a teaching mode; and said position detecting means is installed on said hand portion or said placement base only during a teaching mode.

3. An overhead hoist transfer device as set forth in claim 2, wherein:

said position detecting means comprises a two-dimensional position detecting element; and said indicating means comprises a light emitting device configured to emit a light.

4. An overhead hoist transfer device as set forth in claim 2, wherein:

said position detecting means comprises a CCD camera; and said indicating means comprises an identification mark.

5. An overhead hoist transfer device as set forth in claim 1, wherein:

said position detecting means comprises a two-dimensional position detecting element; and said indicating means comprises a light emitting device configured to emit a light.

6. An overhead hoist transfer device as set forth in claim 1, wherein:

said position detecting means comprises a CCD camera; and said indicating means comprises an identification mark.

7. An overhead hoist transfer device as set forth in any one of claims 1–6, further comprising a sway controlling means for controlling sways of said hand portion.

8. An overhead hoist transfer device having a moving carriage with a hand portion, said hand portion being configured to hold a load and elevatably suspended from said moving carriage, said overhead hoist transfer device comprising:

a teaching device configured to teach an appointed stop position just above a placement base on which said load is placed;

an indicating device configured to indicate an appointed portion and located on said hand portion or said placement base; and a position detecting device provided at said placement base side or said hand portion side and configured to detect the position of said indicating device, wherein said teaching device detects a deviation between a present stop position and said appointed stop position on the basis of a relative position of said hand portion with respect to said placement base obtained by said position detecting device, and teaches said appointed stop position on the basis of said deviation.

* * * * *

UNITED STATES PATENT AND TRADEMARK OFFICE
CERTIFICATE OF CORRECTION

PATENT NO.  : 6,092,678
DATED       : July 25, 2000
INVENTOR(S) : Hitoshi Kawano, et al.

It is certified that error appears in the above-identified patent and that said Letters Patent is hereby corrected as shown below:

Column 2,
Line 22, change "0" to -- $\theta_i$ --;
Line 23, after "is finished", insert -- . --; and
Line 62, change "30 m" to -- 30m --.

Column 3,
Line 1, change "3 (quantity ..." to -- 3(quantity ... --.

Column 5,
Add -- (1) -- at the right side of the expressions below line 41;
Line 64, insert a space between "data" and "Also";
Line 67, change "teacing" to -- teaching --.

Column 6,
Line 27, change "loadport" to -- load port --;
Line 38, delete ":" before "required"; and
Line 64, change "maybe" to -- may be --.

Column 9,
Line 23, change "means; and" to -- means, --;
Lines 38-39, change "claim 2" to -- claim 1 --.

UNITED STATES PATENT AND TRADEMARK OFFICE
CERTIFICATE OF CORRECTION

PATENT NO.   : 6,092,678
DATED        : July 25, 2000
INVENTOR(S)  : Hitoshi Kawano, et al.

It is certified that error appears in the above-identified patent and that said Letters Patent is hereby corrected as shown below:

Column 10,
Lines 1-2, change "claims 2" to -- claim 1 --;
Lines 6-7, change "claim 1" to -- claim 2 --;
Lines 13-14, change "claim 1" to -- claim 2 --.

Signed and Sealed this

Ninth Day of October, 2001

*Attest:*

NICHOLAS P. GODICI
*Attesting Officer*   Acting Director of the United States Patent and Trademark Office